United States Patent
Rush et al.

(10) Patent No.: US 10,386,127 B2
(45) Date of Patent: Aug. 20, 2019

(54) THERMAL MANAGEMENT SYSTEM

(71) Applicant: GENERAL ELECTRIC COMPANY, Schenectady, NY (US)

(72) Inventors: Brian Magann Rush, Schenectady, NY (US); Naveenan Thiagarajan, Schenectady, NY (US); Hendrik Pieter Jacobus De Bock, Clifton Park, NY (US)

(73) Assignee: GENERAL ELECTRIC COMPANY, Niskayuna, NY (US)

(*) Notice: Subject to any disclaimer, the term of this patent is extended or adjusted under 35 U.S.C. 154(b) by 396 days.

(21) Appl. No.: 14/848,860

(22) Filed: Sep. 9, 2015

(65) Prior Publication Data

US 2017/0067693 A1    Mar. 9, 2017

(51) Int. Cl.

| | |
|---|---|
| *F28D 15/02* | (2006.01) |
| *F28F 7/02* | (2006.01) |
| *F28D 15/04* | (2006.01) |
| *F28D 20/02* | (2006.01) |
| *H01L 23/427* | (2006.01) |
| *H05K 7/20* | (2006.01) |
| *F28D 20/00* | (2006.01) |

(52) U.S. Cl.
CPC ............ *F28F 7/02* (2013.01); *F28D 15/0266* (2013.01); *F28D 15/046* (2013.01); *F28D 20/02* (2013.01); *H01L 23/427* (2013.01); *H05K 7/20* (2013.01); *H05K 7/20309* (2013.01); *H05K 7/20318* (2013.01); *F28D 2020/0013* (2013.01); *F28F 2210/02* (2013.01); *F28F 2215/06* (2013.01); *Y02E 60/145* (2013.01)

(58) Field of Classification Search
CPC .......... F28D 2020/0013; F28D 15/046; F28D 15/0266; F28F 7/02; F28F 2210/02; F28F 2215/06; F20D 20/02; H01L 23/427; Y02E 60/145
USPC ....................................... 165/104.21, 104.33
See application file for complete search history.

(56) References Cited

U.S. PATENT DOCUMENTS

| | | | | |
|---|---|---|---|---|
| 4,111,189 | A | * | 9/1978 | Dizon .................... C09K 5/063 126/400 |
| 5,647,429 | A | * | 7/1997 | Oktay ................. F28D 15/0275 165/104.14 |
| 5,761,909 | A |   | 6/1998 | Hughes et al. |
| 6,260,613 | B1 |   | 7/2001 | Pollard, II |
| 6,392,883 | B1 |   | 5/2002 | Ali |

(Continued)

OTHER PUBLICATIONS

Green et al., "Dynamic Thermal management of high heat flux devices using embedded solid-liquid phase change materials and solid state coolers", Thermal and Thermomechanical Phenomena in Electronic Systems, 13th IEEE Intersociety Conference on May 30, 2012-Jun. 1, 2012, pp. 853-862, 2012.

(Continued)

*Primary Examiner* — Joel M Attey
(74) *Attorney, Agent, or Firm* — Fletcher Yoder, P.C.

(57) ABSTRACT

A thermal management system including a first vapor housing configured to receive a fluid that absorbs thermal energy from a first heat source, and a phase change material (PCM) housing thermally coupled to the first vapor housing, wherein the PCM housing is configured to receive a PCM that absorbs thermal energy from the first vapor housing, wherein the first vapor housing and the PCM housing are one-piece.

16 Claims, 7 Drawing Sheets

(56) References Cited

U.S. PATENT DOCUMENTS

| | | | |
|---|---|---|---|
| 6,631,755 B1 | 10/2003 | Kung et al. | |
| 6,889,755 B2 | 5/2005 | Zuo et al. | |
| 6,994,152 B2* | 2/2006 | Rosenfeld | B22F 3/1103 |
| | | | 165/104.21 |
| 7,007,741 B2 | 3/2006 | Sen et al. | |
| 7,473,995 B2 | 1/2009 | Rumer et al. | |
| 8,934,235 B2* | 1/2015 | Rubenstein | G06F 1/206 |
| | | | 165/185 |
| 8,937,384 B2 | 1/2015 | Bao et al. | |
| 9,476,651 B2* | 10/2016 | Thiagarajan | F28D 15/02 |
| 9,974,157 B2 | 5/2018 | De Bock et al. | |
| 2002/0144811 A1 | 10/2002 | Chou et al. | |
| 2004/0011503 A1* | 1/2004 | Kung | F28D 15/02 |
| | | | 165/46 |
| 2005/0207120 A1 | 9/2005 | Tseng et al. | |
| 2006/0140346 A1 | 6/2006 | McCarthy, Jr. | |
| 2007/0012429 A1 | 1/2007 | Siu | |
| 2011/0016886 A1 | 1/2011 | Ghoshal et al. | |
| 2012/0125573 A1* | 5/2012 | Rubenstein | F28D 15/00 |
| | | | 165/104.33 |
| 2013/0098417 A1 | 4/2013 | Gavillet | |
| 2013/0189594 A1 | 7/2013 | Breit et al. | |
| 2014/0150464 A1* | 6/2014 | Bloedow | F25D 11/006 |
| | | | 62/3.62 |
| 2014/0158334 A1 | 6/2014 | Dellea et al. | |
| 2014/0284020 A1* | 9/2014 | Amir | F28D 15/02 |
| | | | 165/10 |
| 2014/0340845 A1* | 11/2014 | Straznicky | H05K 7/20 |
| | | | 361/689 |
| 2015/0000871 A1 | 1/2015 | Farner et al. | |
| 2015/0040888 A1 | 2/2015 | Zakhidov et al. | |
| 2015/0237762 A1* | 8/2015 | Holt | H05K 7/20336 |
| | | | 165/104.21 |
| 2015/0289413 A1 | 10/2015 | Rush et al. | |
| 2016/0305279 A1 | 10/2016 | Gerstler et al. | |
| 2017/0064868 A1 | 3/2017 | Rush et al. | |

OTHER PUBLICATIONS

Great Britain Combined Search and Examination Report issued in connection with corresponding EP Application No. 1614907.2 dated Jan. 24, 2017.
U.S. Appl. No. 14/570,204, filed Dec. 15, 2014, Unknown.
U.S. Appl. No. 14/592,387, filed Jan. 8, 2015, Unknown.
Great Britain Office Action issued in connection with corresponding GB Application No. GB1614907.2 dated Oct. 30, 2017.
Great Britain Office Action issued in connection with corresponding GB Application No. GB1614907.2 dated Mar. 20, 2018.

* cited by examiner

THERMAL MANAGEMENT SYSTEM

BACKGROUND

Heat sinks cool mechanical and electrical components by removing thermal energy. For example, modern electronics use a variety of electrical components (e.g., microchips) that generate significant amounts of thermal energy during operation. In order to protect these electrical components from excess heat, the electronics may thermally couple to a heat sink. Normally a heat sink continuously removes thermal energy from the electrical components and transfers it to the environment through convection, conduction, and/or radiation. However, some of these components may operate in unsteady cooling conditions. In other words, the heat sink's ability to transfer thermal energy to the environment through conduction, convection, and/or radiation may be temporarily or permanently limited. Unfortunately, existing systems may not effectively cool a mechanical or electrical component in these unsteady cooling conditions.

BRIEF DESCRIPTION

In one embodiment, a thermal management system includes a first vapor housing configured to receive a fluid that absorbs thermal energy from a first heat source. The thermal management system also includes a phase change material (PCM) housing, wherein the PCM housing is configured to receive a PCM that absorbs thermal energy from the first vapor housing.

In another embodiment, a thermal management system includes a first vapor housing configured to receive a fluid that absorbs thermal energy from a first heat source. The first vapor housing includes a conduit. The thermal management also includes a first PCM housing, wherein the first PCM housing is configured to receive a PCM that absorbs thermal energy from the fluid. And finally, the conduit is configured to thermally couple the first vapor housing to the first PCM housing.

In a further embodiment, a method of transferring thermal energy from a heat source, including absorbing the thermal energy from the heat source with a fluid in a vapor housing, and transferring the thermal energy in the fluid to a PCM in a PCM housing.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure The present embodiments disclose a thermal management system capable of removing thermal energy from a heat source in both steady cooling conditions (e.g., normal heat transfer from the thermal management system to the environment) and unsteady cooling conditions (e.g., interrupted heat transfer to environment, excess thermal energy production by a heat source). In some embodiments, the thermal management system includes a fluid within a vapor housing that absorbs thermal energy from a heat source. To facilitate heat transfer to the environment, the vapor housing may include conduits or fins that increase heat transfer. Moreover, the thermal management system may include a phase change material (PCM) housing filled with phase change material (PCM) that thermally couples to the vapor housing. The thermal management system may use the PCM to absorb and/or store thermal energy from the vapor housing during steady and/or unsteady cooling conditions.

Figure 1:
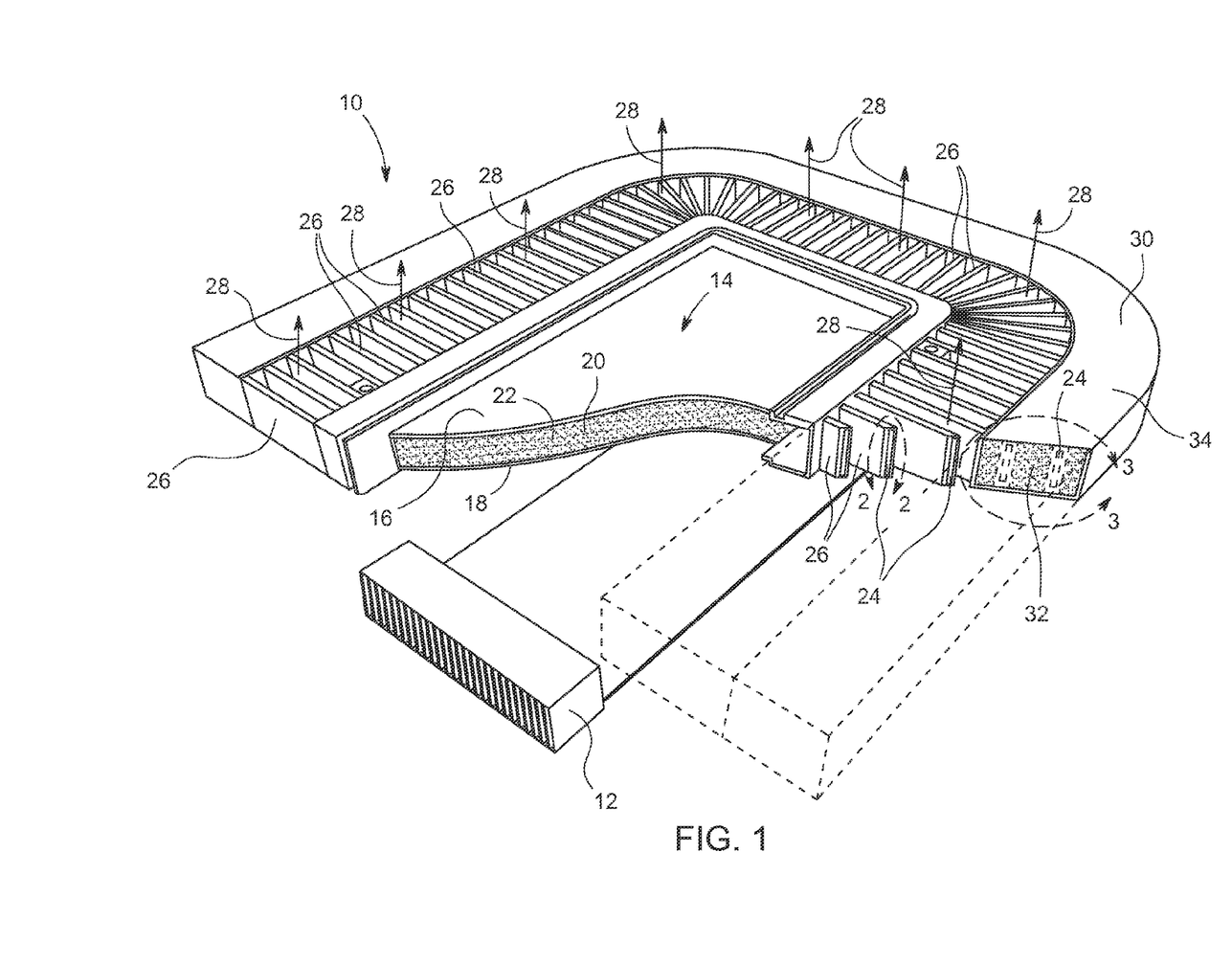
FIG. 1 is a partial cutaway perspective view of an embodiment of a thermal management system.

FIG. 1 is a partial cutaway perspective view of an embodiment of a thermal management system 10 (e.g., heat sink) capable of removing thermal energy from an electrical and/or mechanical heat source 12 (e.g., a circuit card assembly) in steady and unsteady cooling conditions. For example, the thermal energy management system 10 may remove thermal energy from a chip, avionics card, motherboard, etc. In order to rapidly remove thermal energy from the heat source 12, the thermal energy management system 10 includes a vapor housing 14 with a low thermal resistance. As illustrated, the vapor housing 14 includes a first plate 16 and a second plate 18 that form a cavity 20. In some embodiments, the first and second plates 16, 18 may be manufactured so that they conform to one or more surfaces of a mechanical or electrical heat source 12. A vapor housing 14 that conforms to the mechanical or electrical heat source 12 may increase heat transfer by minimizing the distance between the vapor housing 14 and the heat source 12 (e.g., the vapor housing 14 may directly contact or nearly contact the heat source 12). Furthermore, in some embodiments, there may be multiple thermal management systems 10 stacked one on top of the other with a heat source 12 in between one or more of the thermal management systems 10. The heat sources 12 may have the same or different shapes and the thermal management systems 10 (e.g., vapor housing 14) may conform to those shapes.

In operation, the vapor housing 14 conducts energy from the heat source 12 through the first or second plates 16, 18, depending on which plate is next to the heat source 12. In some embodiments, both the first and second plates 16, 18 may be in contact with separate heat sources 12. As the first plate 16 and/or second plate 18 absorb thermal energy, the first plate 16 and/or second plate 18 transfer the thermal energy to a fluid 22 (e.g., water, ammonia, etc.) within the cavity 20. As the fluid 22 absorbs the thermal energy, the fluid 22 phase changes from a liquid to a gas. In the vapor phase, the fluid 22 enters one or more passages 24 in a conduit or fin 26. In some embodiments, the vapor housing 14 may include one or more conduits or fins 26 (e.g., 1, 5, 10, 15, 20, 25 or more), with each conduit or fin 26 having one or more passages 24 (e.g., 1, 2, 3, 4, 5, or more) that receive the fluid 22.

During steady cooling conditions, a cooling fluid 28 (e.g., gas and/or liquid) flows around the fins 26 and convectively removes thermal energy from the fins 26 to cool the fluid 22. As the cooling fluid 28 removes thermal energy from the fins 26, the fluid 22 cools and condenses (i.e., changes from a vapor phase into a liquid phase). The liquid phase of the fluid 22 then recirculates back to the cavity 20 through gravity and/or capillary forces where the fluid 22 again absorbs thermal energy from the first and/or second plates 16, 18. In some situations the flow of the cooling fluid 28 may stop (e.g., fan failure) and/or the heat source 12 may produce excess thermal energy that cannot be transferred fast enough to the environment. These situations may be referred to as unsteady cooling conditions. In order to compensate for unsteady cooling conditions, the thermal management system 10 includes a phase change material (PCM) housing 30 with phase change material (PCM) 32 (e.g., paraffin wax, hydrated salts, metals, fatty acids, etc.) in thermal communication with the vapor housing 14. In operation, the PCM 32 is able to store thermal energy that the thermal energy management system 10 is temporarily unable to transfer to the environment.

As illustrated, one or more of the fins 26 extend into the PCM housing 30 where the PCM 32 surrounds the fins 26. Accordingly, the PCM 32 is able to absorb thermal energy from the fins 26, which in turn cools the fluid 22. The thermal energy stored by the PCM 32 may then be transferred from the outer surface 34 of the PCM housing 30 and/or fins 26 (e.g., during steady state cooling conditions) to the environment. In this way, the PCM 32 acts as a failsafe for cooling the heat source 12 during unsteady cooling conditions. In order to block the loss of PCM 32 from the PCM housing 30, the thermal management system 10 may be manufactured as a single piece (e.g., one-piece). In other words, the vapor housing 14, fins 26, and PCM housing 30 may integrally formed. For example, the thermal management system 10 may be manufactured using an additive manufacturing process (e.g., selective laser sintering, direct metal laser sintering, selective laser melting). By manufacturing the thermal management system 10 as one-piece the thermal management system 10 can block leakage of PCM 32 without using gaskets or seals. Moreover, forming the thermal management system 10 out of a single piece enables production of a highly conductive vapor housing 14 that may be formed into any shape.

Figure 2:
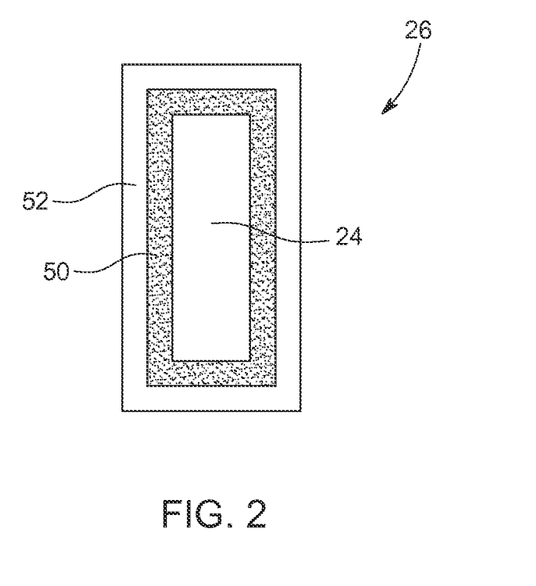
FIG. 2 is a cross-sectional view of an embodiment of a fin within line 2-2 of FIG. 1.

FIG. 2 is a cross-sectional view within line 2-2 of FIG. 1 of a conduit or fin 26. In FIG. 2, the conduit or fin 26 has a rectangular shape. However, other embodiments may include conduits or fins 26 with a different shape (e.g., circular, square, irregular, airfoil shaped). As explained above, the conduit or fin 26 includes at least one passage 24 (e.g., lumen, cavity) that carries the vapor phase of the fluid 22 to the PCM housing 30. As the vapor phase of the fluid 22 travels through the conduit or fin 26, it transfers thermal energy to a cooling fluid 28 that flows around the conduit or fin 26 and/or through heat transfer with the PCM 32. Either way the fluid 22 loses thermal energy and condenses into the liquid phase. In some embodiments, the fluid 22 may change phases in a wicking layer 50 that wicks the liquid phase of the fluid 22 back to the vapor housing 14. In some embodiments, the wicking or inner layer 50 may be a porous layer of material (e.g., metal) that absorbs and then wicks the liquid phase of the fluid 22 back into the vapor housing 14. In order to block the loss of the fluid 22 through the wicking layer 50, the conduit or fin 26 includes a non-porous outer layer 52 that surrounds the wicking or inner layer 50. In some embodiments, the inner and outer layers 50, 52 may be made out different materials (e.g., metals with different porosities). In other embodiments, the inner and outer layers 50, 52 may be made out of the same material (e.g., metal) with the inner and outer layers 50, 52 differing in porosity.

Figure 3:
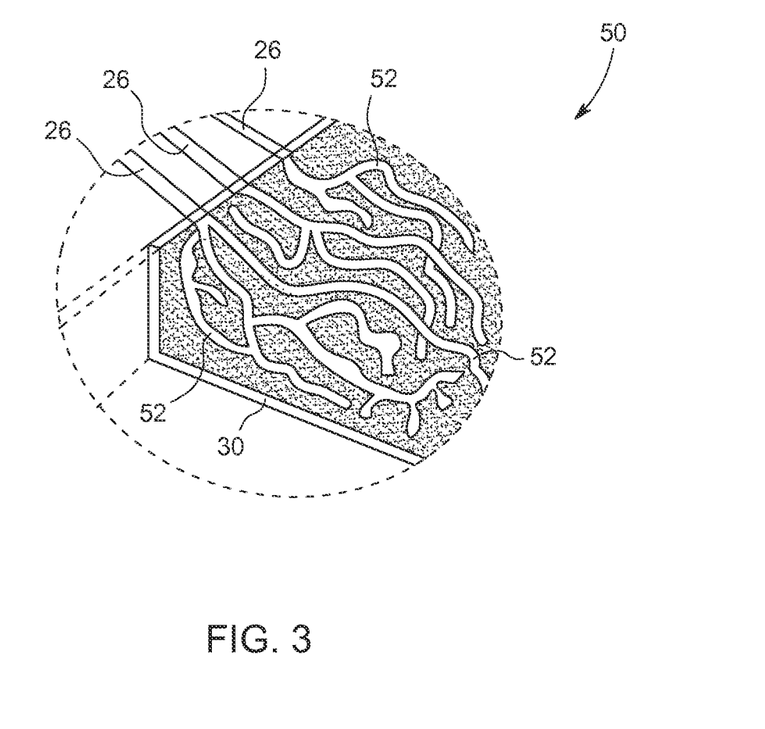
FIG. 3 is a partial sectional perspective view of an embodiment of a thermal management system with a vascular network within line 3-3 of FIG. 1.

FIG. 3 is a partial perspective sectional view of an embodiment of a thermal management system 10 with a vapor housing 14 that has a vascular network 50 (e.g., root-like network) within line 3-3 of FIG. 1. As illustrated, the vascular network 50 includes a plurality of conduits or passageways 52 that may vary in size, length, orientation, etc. throughout the PCM housing 30. These conduits 52 fluidly couple to the passages 24 in the fins 26. In operation, the conduits 52 carry the fluid 22 from the fins 26 into the PCM housing 30. As the fluid 22 travels through the conduits 52, the fluid 22 exchanges thermal energy with the PCM 32. In some embodiments, the vascular network 50 may increase heat transfer to the PCM 32 by increasing the surface area in contact with the PCM 32.

Figure 4:
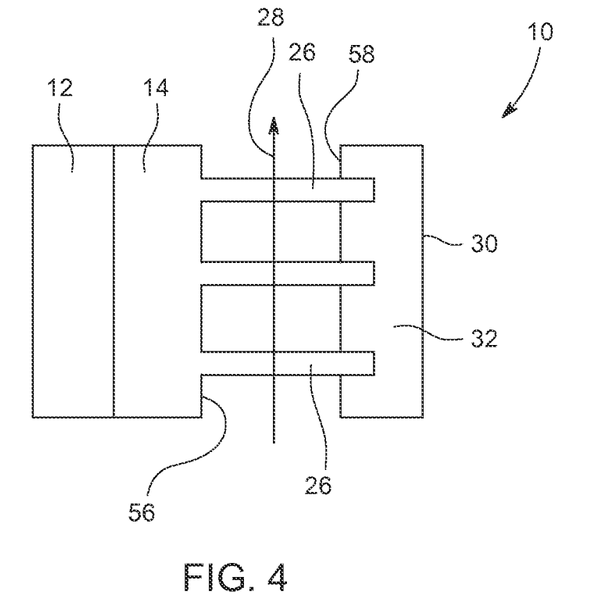
FIG. 4 is a schematic view of an embodiment of a thermal management system.
Figure 5:
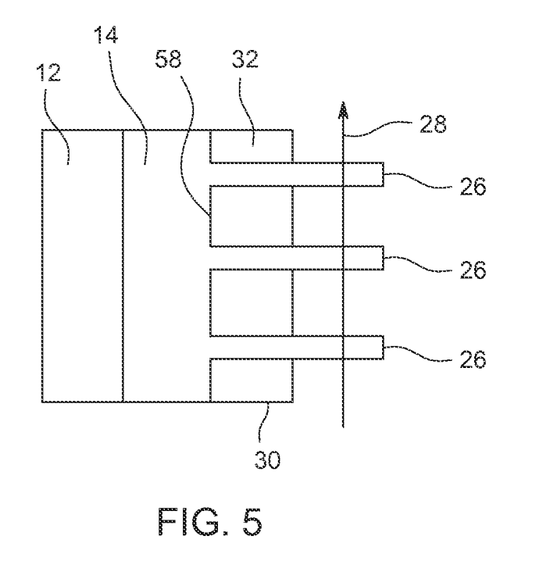
FIG. 5 is a schematic view of an embodiment of a thermal management system.
Figure 6:
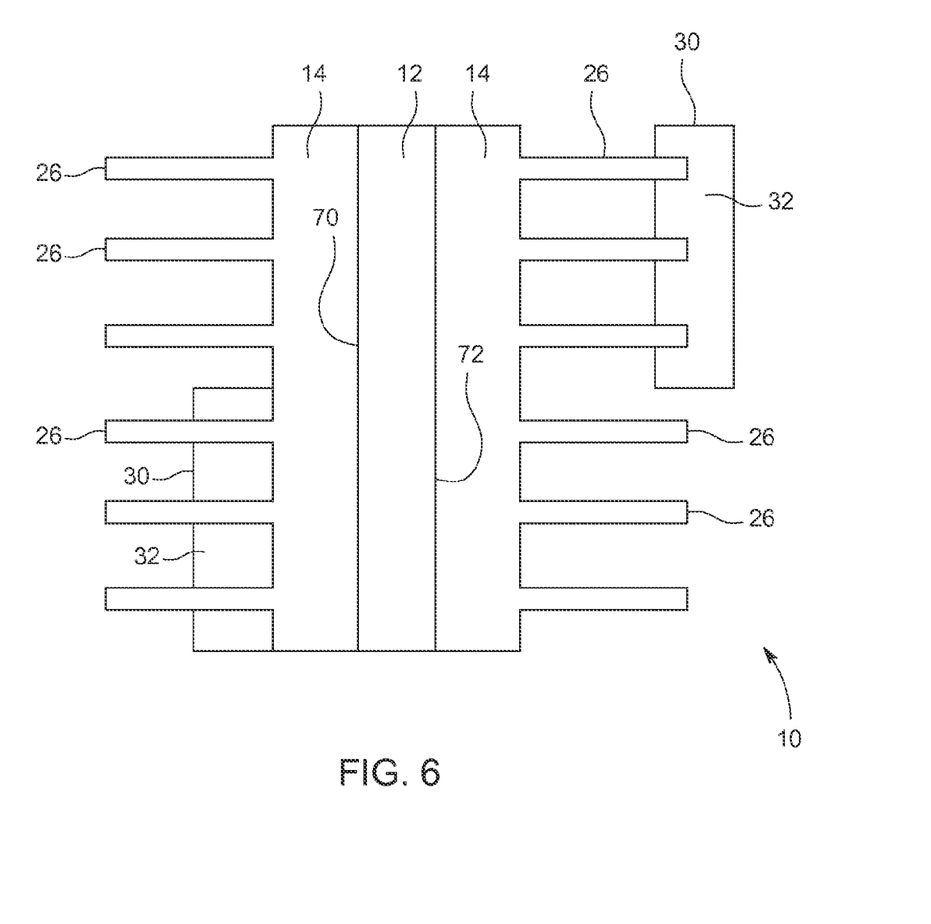
FIG. 6 is a schematic view of an embodiment of a thermal management system.

FIGS. 4, 5, and 6 are schematic views of the thermal management system 10 illustrating different configurations of the vapor housing 14, fins 26, and PCM housing 30. For example, in FIG. 4 the thermal management system 10 may be configured to couple a vapor housing 14 to a heat source 12, while thermally coupling the vapor housing 14 to the PCM housing 30 with fins 26. In this configuration, the cooling fluid cools the fluid 22 as it passes through the fins 26. This configuration also facilitates convective heat transfer from the vapor housing 14 and PCM housing 30 as the cooling fluid 28 flows past a surface 56 of the vapor housing 14 and a surface 58 of the PCM housing 30.

In FIG. 5 the thermal management system 10 directly couples the PCM housing 30 to the vapor housing 14. Accordingly, the PCM housing 30 is able to absorb thermal energy directly from the vapor housing 14. As illustrated, the fins 26 extend completely through the PCM housing 30 in order to expose the fins 26 to the cooling fluid 28. In some embodiments, one or more of the fins 26 may not extend completely through the PCM housing 30. In still other embodiments, some of the fins 26 may extend further away from a surface 60 of the PCM housing 30 than others, thus providing additional surface area for heat transfer with the cooling fluid 28.

In FIG. 6 the thermal management system 10 includes more than one vapor housing 14 and PCM housing 30. For example, the thermal management system 10 may include two or more vapor housings 14 that couple to respective first and second sides 70, 72 of the heat source 12. Each of these vapor housings 14 may include one or more fins 26 that extend from the vapor housings 14. As explained above, the fins 26 facilitate heat transfer by increasing the surface area in contact with the cooling fluid 28. In some embodiments, some or all of the fins 26 couple to a PCM housing 30 that absorbs thermal energy from the fins 26 with PCM 32. As illustrated, the PCM housings 30 may couple directly to the vapor housing 14 and/or be spaced away from the vapor housing 14. Furthermore, in some embodiments one or more of the fins 26 may couple to more than one PCM housing 32.

Figure 7:
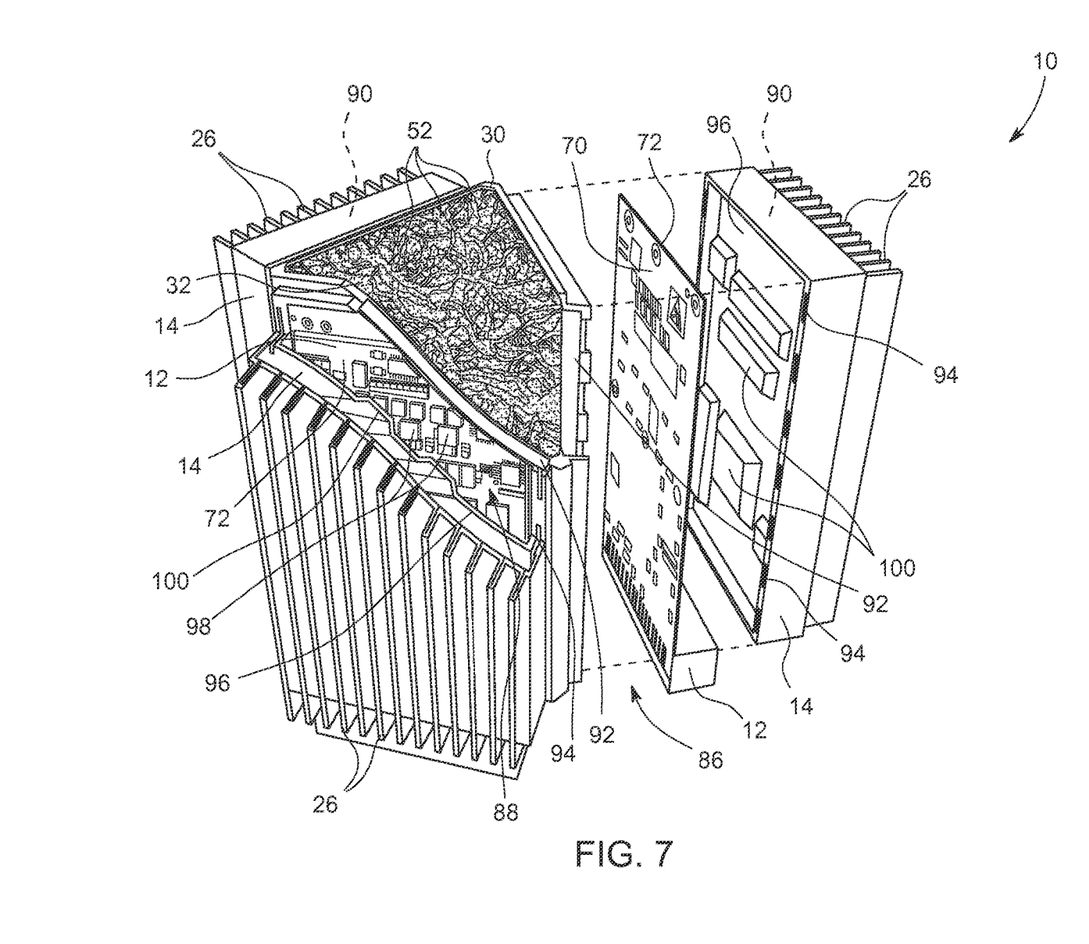
FIG. 7 is a partial cutaway perspective view of an embodiment of a thermal management system.

FIG. 7 is a partial cutaway perspective view of an embodiment of a thermal management system 10. The thermal management system 10 includes a chassis 86 (e.g., frame, structure) that enables the thermal management system 10 to support multiple vapor housings 14 and/or PCM housings 30, which may cool multiple heat sources 12 (e.g., 1, 2, 3, 4, 5, or more). In FIG. 7, the chassis 86 is triangular; however, in other embodiments, the chassis 86 may be cylindrical, square, rectangular, or another multifaceted shape, etc. As illustrated, the chassis 86 may also double as the PCM housing 30. Moreover, the vapor housing 14 may include a vascular network 50 within the PCM housing and surrounded by PCM 32, similar to that described in FIG. 3. As explained above, the vascular network 50 includes a plurality of conduits or passageways 52 that may increase the surface area of the vapor housing 14 and thus increase heat transfer with the PCM 32.

As illustrated, the thermal management system 10 may include vapor housings 14 that surround first and second sides/surfaces 70, 72 of heat sources 12 (e.g., electronics card) to increase cooling. For example, the vapor housings 14 may form cavities 88 (e.g., pocket, passage, etc.) that receive a respective heat source 12. In some embodiments, the vapor housings 14 may include first and second cavities 90, 92 that fluidly couple with passageways 94, which enables the fluid 22 to flow between the first and second cavities 90, 92. However, in some embodiments the first and second cavities 90, 92 may be part of separate vapor housings 14 that may mechanically couple together but do not fluidly communicate with one another.

In order to increase heat transfer from the heat source 12, each of the vapor housings 14 may include surfaces (e.g., surface 96) that conform to the shape of the heat source 12. For example, the heat source 12 may include components 98 (e.g., microchips) that create uneven first and/or second sides/surfaces 70, 72. Accordingly, the vapor housing surface 96 may include protrusions 100 that enable the vapor housing 14 to conform to the heat source 12, while still enabling a heat source 12 to be inserted into a respective cavity 88. By conforming to the heat source 12, the vapor housing 14 minimizes the distance between the vapor housing 14 and sides 70, 72 of the heat source 12, thus increasing heat transfer from the heat source 12.

Figure 8:
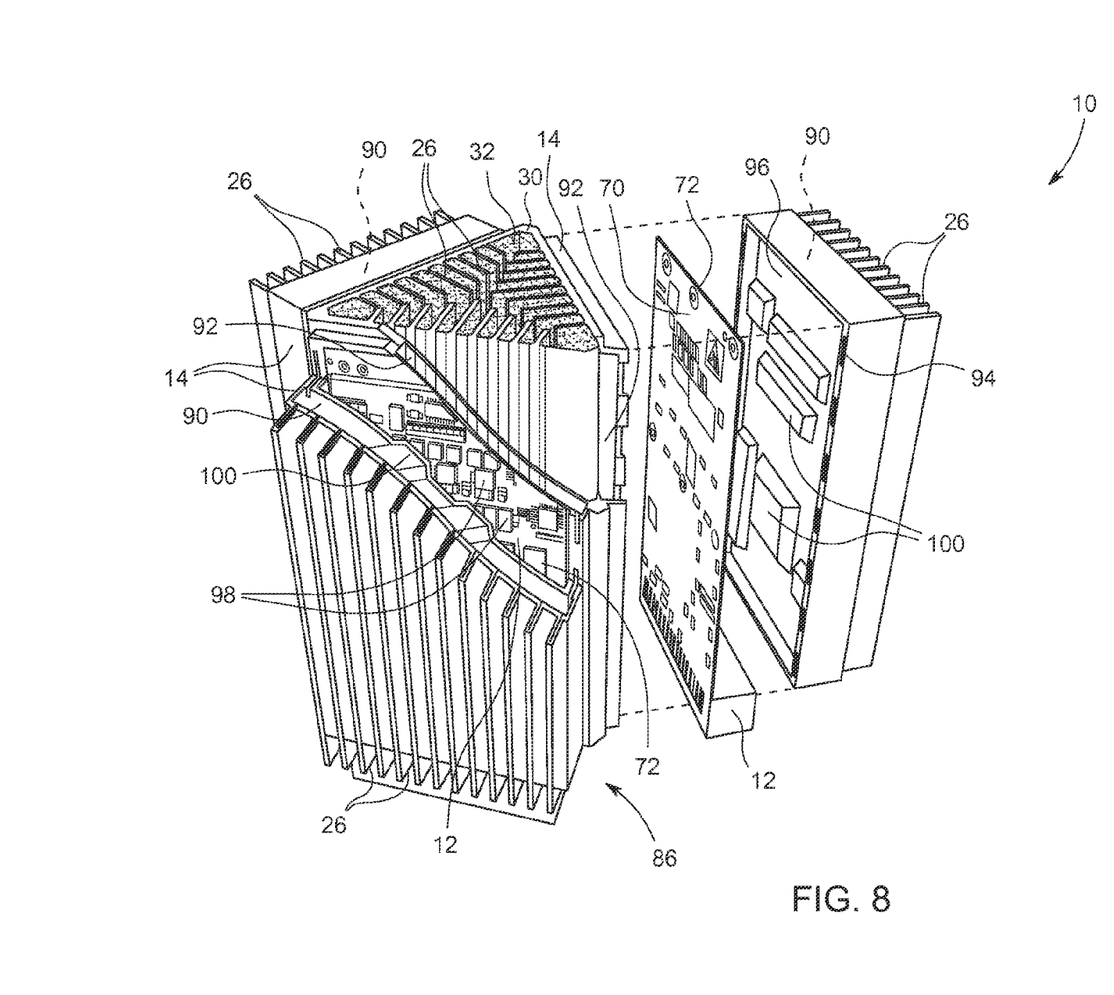
FIG. 8 is a partial cutaway perspective view of an embodiment of a thermal management system.

FIG. 8 is a partial cutaway view of an embodiment of a thermal management system 10. The thermal management system 10 includes a chassis 86 (e.g., frame, structure) that enables the thermal management system 10 to simultaneously cool multiple heat sources 12 (e.g., 1, 2, 3, 4, 5, or more). In some embodiments, the chassis 86 may also double as the PCM housing 30. However, instead of a vascular network 50, as shown in FIG. 7, the PCM housing 30 receives one or more fins 26 of the vapor housings 14 that fluidly couple to the cavities 92. Moreover, the thermal management system 10 may also include fins 26 that fluidly couple to the cavities 90. In this configuration, some of the fins 26 exchange thermal energy with the PCM 32 and others directly with the environment surrounding the thermal management system 10.

As explained above, the vapor housings 14 may surround first and second sides 70, 72 of the heat sources 12 (e.g., electronics card) to increase cooling. For example, the vapor housings 14 may form cavities 88 (e.g., pocket, passage, etc.) that receive a respective heat source 12. In some embodiments, the vapor housings 14 may include first and second cavities 90, 92 that fluidly couple with passageways 94. However, in some embodiments the first and second cavities 90, 92 may be within separate vapor housings 14 that do not fluidly communicate with one another. Either way, the first and/or second cavities 90, 92 of the vapor housings 14 may include fins 26, which increase the surface area available for heat transfer.

Figure 9:
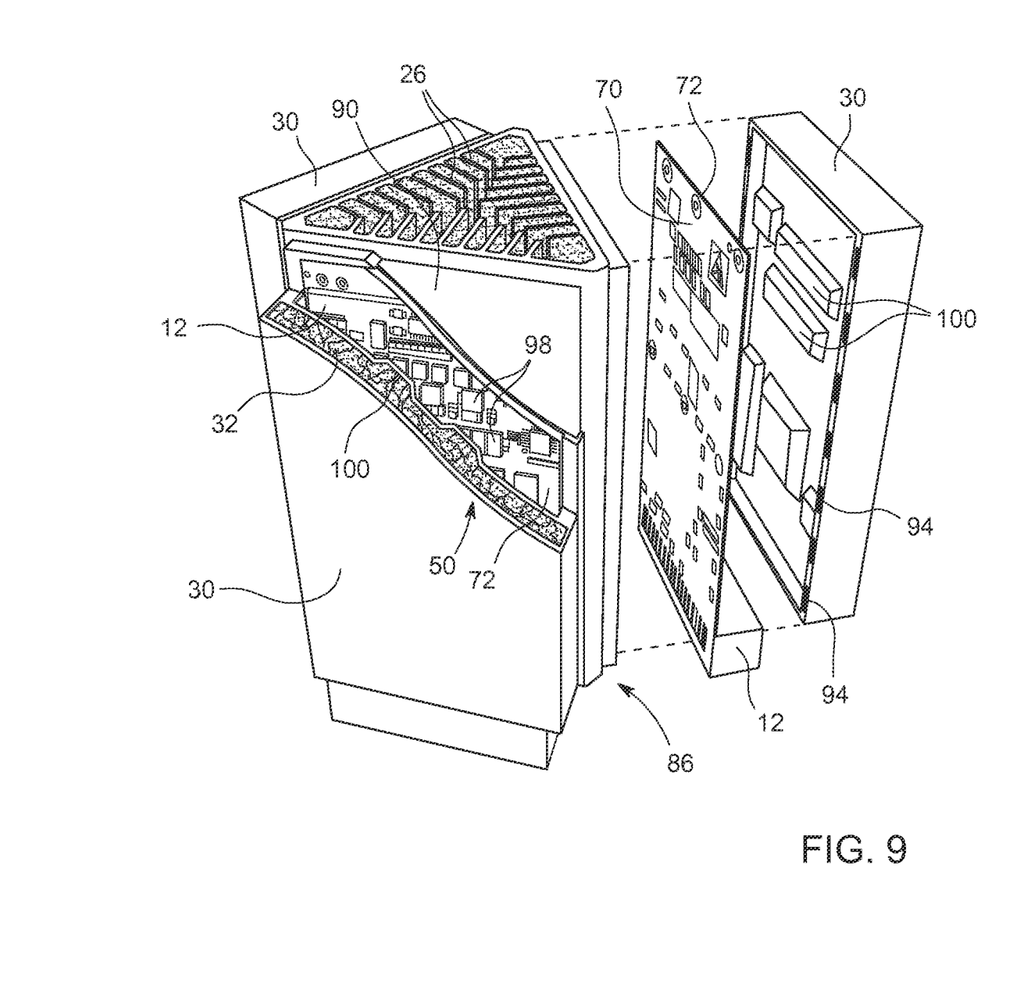
FIG. 9 is a partial cutaway perspective view of an embodiment of a thermal management system.

FIG. 9 is a partial cutaway view of an embodiment of a thermal management system 10. The thermal management system 10 includes a chassis 86 (e.g., frame, structure) that enables the thermal management system 10 to simultaneously cool multiple heat sources 12 (e.g., 1, 2, 3, 4, 5, or more). However, instead of vapor housings 14 that extend over both first and second sides 70, 72 of the heat source 12, the thermal management system 10 may include a PCM housing 30 that covers either the first or second side 70, 72 of the heat source 12, and a vapor housing 14 covering the opposite side. As illustrated, the PCM housing 30 may receive a vascular network 50 of the vapor housing 14. The vascular network 50 includes a plurality of conduits or passageways 52 that may vary in size, length, orientation, etc. In this way, the PCM 32 may absorb thermal energy directly from the heat source 12 through contact with the PCM housing 30, as well as from the vapor housing 14. Furthermore, to increase heat transfer from the heat source 12, the vapor housing 14 may include one or more fins 26 that facilitate convective heat transfer to the environment (e.g., cooling fluid 28).

Technical effects of the invention include a thermal management system capable of removing thermal energy from a heat source in both steady and unsteady cooling conditions. For example, during steady state conditions the thermal energy management system may convectively transfer thermal energy from a vapor housing using fins. In unsteady cooling conditions such as an interruption in a flow of cooling fluid or excess thermal energy production from a heat source, the thermal management system absorbs thermal energy with PCM stored within a PCM housing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A thermal management system, comprising:
 a first vapor housing comprising a cavity configured to receive a fluid that absorbs thermal energy from a first heat source; and
 a phase change material (PCM) housing thermally coupled to the first vapor housing, wherein the PCM housing comprises a PCM;
 wherein the first vapor housing further comprises a plurality of fins extending completely through the PCM housing, the plurality of fins configured to receive the fluid after absorption of thermal energy from the heat source and to circulate the heated fluid through the PCM housing, wherein the PCM in the PCM housing is configured to absorb thermal energy from the heated fluid thereby cooling the fluid, and the plurality of fins is further configured to recirculate the cooled fluid from the PCM housing back to the cavity in the first vapor housing.

2. The system of claim 1, wherein the first vapor housing comprises at least one surface that conforms to a shape of the first heat source.

3. The system of claim 1, wherein the plurality of fins enables convective heat transfer to a cooling fluid.

4. The system of claim 1, comprising a second vapor housing and a second PCM housing, wherein the second vapor housing and second PCM housing are stackable with the first vapor housing and the first PCM housing.

5. The system of claim 1, comprising a chassis that supports the first vapor housing and a second vapor housing, wherein the second vapor housing is configured to remove thermal energy from a second heat source.

6. A thermal management system, comprising:
a first vapor housing comprising a cavity configured to receive a fluid that absorbs thermal energy from a first heat source, the first vapor housing comprising a plurality of fins, wherein the at least one fin of the plurality of fins comprises at least one passage and a wicking layer surrounding the at least one passage; and
a first PCM housing comprising a PCM;
wherein the plurality of fins extends completely through the PCM housing, the plurality of fins is configured to receive the fluid after absorption of thermal energy from the heat source, and circulate the heated fluid through the PCM housing, wherein the PCM in the PCM housing is configured to absorb thermal energy from the heated fluid thereby cooling the fluid, and the plurality of fins is further configured to recirculate the cooled fluid from PCM housing back to the cavity in the first vapor housing via the wicking layer of the at least one fin of the plurality of fins.

7. The system of claim 6, comprising a chassis configured to support the first vapor housing, the first PCM housing, and a second vapor housing.

8. The system of claim 7, wherein the first vapor housing and the second vapor housing are configured to thermally couple to the first PCM housing.

9. The system of claim 8, wherein the first vapor housing is configured to thermally couple to the first heat source and the second vapor housing is configured to thermally couple to a second heat source.

10. The system of claim 6, comprising a second vapor housing and a second PCM housing, wherein the first vapor housing fluidly couples to the first PCM housing and the second vapor housing fluidly couples to the second PCM housing.

11. The thermal management system of claim 1, wherein the PCM housing and the first vapor housing are additively-manufactured together as a single piece.

12. The thermal management system of claim 1, wherein the the plurality of fins is configured to circulate a vapor phase of the heated fluid through the PCM housing, and recirculate a liquid phase of the cooled fluid from the PCM housing to the cavity in the vapor housing via one or both of gravity and capillary force.

13. The thermal management system of claim 12, wherein each fin of the the plurality of fins comprises at least one passage and a wicking layer surrounding the at least one passage, wherein the wicking layer is configured to recirculate the liquid phase of the cooled fluid from the PCM housing to the cavity in the vapor housing.

14. A thermal management system for cooling a plurality of heat sources, comprising:
a plurality of first vapor housings, each first vapor housing of the plurality of first vapor housings comprising a cavity configured to receive a fluid that absorbs thermal energy from a respective heat source;
a phase change material (PCM) housing thermally coupled to the plurality of first vapor housings, the PCM housing comprising a PCM;
wherein each vapor housing of the plurality of first vapor housings further comprises a plurality of fins extending completely through the PCM housing, the plurality of fins configured to receive the fluid after absorption of thermal energy from the heat source, and wherein at least one fin of the plurality of fins is configured to circulate the heated fluid through the PCM housing, the PCM in the PCM housing is configured to absorb thermal energy from the heated fluid thereby cooling the fluid, and the at least one fin of the plurality of fins is further configured to recirculate the cooled fluid from the PCM housing back to the cavity in the respective first vapor housing of the plurality of first vapor housings.

15. The thermal management system of claim 14, wherein the at least one fin of the plurality of fins comprises at least one passage and a wicking layer surrounding the at least one passage, wherein the wicking layer is configured to recirculate the liquid phase of the cooled fluid from the PCM housing to the cavity in the respective vapor housing of the plurality of first vapor housings.

16. The thermal management system of claim 14, wherein at least one fin of the plurality of fins is configured to exchange thermal energy directly with the surrounding environment.

* * * * *